US009490197B2

(12) United States Patent
Farooq et al.

(10) Patent No.: US 9,490,197 B2
(45) Date of Patent: Nov. 8, 2016

(54) THREE DIMENSIONAL ORGANIC OR GLASS INTERPOSER

(71) Applicant: INTERNATIONAL BUSINESS MACHINES CORPORATION, Armonk, NY (US)

(72) Inventors: Mukta G. Farooq, Hopewell Junction, NY (US); William F. Landers, Wappingers Falls, NY (US); Jin Liu, Chappaqua, NY (US); Andrew J. Martin, Carmel, NY (US); Kathryn E. Schlichting, Pleasant Valley, NY (US); Melissa A. Smith, Wappingers Falls, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/541,803

(22) Filed: Nov. 14, 2014

(65) Prior Publication Data
US 2016/0141237 A1    May 19, 2016

(51) Int. Cl.
H01L 23/498    (2006.01)
H01L 21/48     (2006.01)
H05K 1/03      (2006.01)
H05K 3/42      (2006.01)
H05K 3/00      (2006.01)

(52) U.S. Cl.
CPC ....... *H01L 23/49827* (2013.01); *H01L 21/486* (2013.01); *H01L 21/4857* (2013.01); *H01L 23/49822* (2013.01); *H01L 23/49866* (2013.01); *H05K 1/0306* (2013.01); *H05K 1/0313* (2013.01); *H05K 3/007* (2013.01); *H05K 3/0017* (2013.01); *H05K 3/423* (2013.01); *H05K 2203/0733* (2013.01); *H05K 2203/143* (2013.01); *H05K 2203/1461* (2013.01)

(58) Field of Classification Search
CPC ............ H01L 21/4857; H01L 21/486; H01L 23/49827
See application file for complete search history.

(56) References Cited

U.S. PATENT DOCUMENTS

| 5,538,758 A | 7/1996 | Beach et al. |
| 2013/0242493 A1* | 9/2013 | Shenoy ............. H01L 23/49827 361/679.21 |
| 2014/0004664 A1 | 1/2014 | Oganesian |
| 2014/0017878 A1 | 1/2014 | Monadgemi |

OTHER PUBLICATIONS

Unknown, "How to . . . Basics of Parylene Conformal Coating", NEXUS Conformal Coating Consultancy, http://www.conformalcoatingconsultancy.com/How-To-Basics-of-Parylene-Conformal-Coating, uploaded on Apr. 30, 2014, three pages.
Yoo, et al., "Spin-on-Glass Bake and Cure using Resistively Heated Batch Annealing Oven", WaferMasters Inc., uploaded on Apr. 30, 2014, one page.

* cited by examiner

*Primary Examiner* — Daniel Shook
(74) *Attorney, Agent, or Firm* — Yuanmin Cai; Andrew M. Calderon; Roberts Mlotkowski Safran Cole & Calderon, P.C.

(57) ABSTRACT

A three-dimensional organic structure or glass interposer structure and methods of manufacture are disclosed. The method includes forming lined metal vias in a substrate. The method further includes removing the substrate, leaving the lined metal vias. The method further includes forming a new substrate about the lined metal vias. The method also includes connecting the lined metal vias to wiring layers using back end of the line processes.

19 Claims, 5 Drawing Sheets

THREE DIMENSIONAL ORGANIC OR GLASS INTERPOSER

FIELD OF THE INVENTION

The invention relates to semiconductor structures and, more particularly, to three-dimensional organic or glass interposer structures and methods of manufacture thereof.

BACKGROUND

The formation of vias in glass or organic substrates can be very slow, with difficulties achieving tight pitches and very small via dimensions. In fact, known processing methods for forming vias in glass are prone to creating defects in the substrate (e.g., laser ablation, electric discharge, blasting). Some of these methods also struggle to create through silicon vias (TSVs) with sidewall angles within a few degrees of vertical. In these cases, it has been observed that non-vertical sidewalls significantly degrade transmission through the vias. Also, it is difficult to plate aspect ratios greater than depth/diam=10 in glass or organic substrates.

SUMMARY

In an embodiment, a method includes forming lined metal vias in a substrate. The method further includes removing the substrate, leaving the lined metal vias connected to a surface of wiring layers or a handler wafer. The method further includes forming a new substrate about the lined metal vias. The method further includes connecting the lined metal vias to wiring layers using back end of the line processes.

Additionally, in an embodiment, a method includes: etching a plurality of openings in a silicon based substrate; depositing an insulator material on sidewalls of the plurality of openings; forming metal material on the insulator material within the plurality of openings; removing the silicon based substrate with the insulator material acting as an etch stop to protect the metal material within the plurality of openings, wherein the insulator material and the metal material remain connected to a handler wafer or at least one wiring layer; forming a new substrate over the insulator material covering the plurality of openings; and forming the at least one wiring layer in electrical contact with the metal material within the plurality of openings.

In addition, a structure includes a glass or organic substrate and a plurality of through silicon vias in the glass or organic substrate, connecting to back end of the line wiring layers. The plurality of through silicon vias includes an insulator lining material, a barrier metal and an electroplated conductive material.

BRIEF DESCRIPTION OF THE SEVERAL VIEWS OF THE DRAWINGS

The invention is described in the detailed description which follows, in reference to the noted plurality of drawings by way of non-limiting examples of exemplary embodiments.

DETAILED DESCRIPTION

Figure 1:
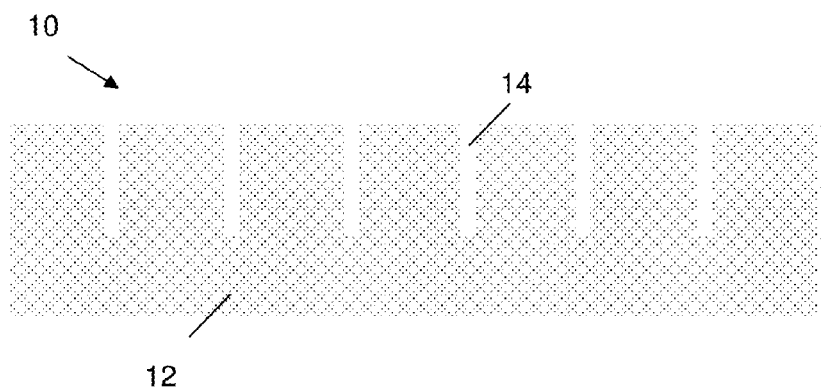
FIG. 1 shows a beginning structure and respective fabrication processes in accordance with an embodiment of the invention.

The invention relates to semiconductor structures and, more particularly, to three-dimensional organic or glass interposer structures and methods of manufacture thereof. More specifically, an embodiment utilizes a Cloisonné method (e.g., a method of forming a space) for fabricating three-dimensional structures with organic or glass substrates. In an embodiment, the three-dimensional structures are metal vias encapsulated with an insulating material.

In a more specific embodiment, the structures and methods of fabricating are directed to 2.5-dimensional or three-dimensional organic or glass interposers using a substrate swapping ('cloisonné') technique. For example, in an embodiment, an initial Si substrate is formed with through silicon vias (TSVs) or blind vias of fine dimensions and narrow pitch fabricated using conventional fabrication techniques, e.g., reactive ion etch (RIE), insulator lining, barrier lining, and metal plating. The substrate can then be removed and replaced with an organic substrate such as parylene or a glass substrate such as a spin-on glass that is deposited/grown/spun/formed on/around the TSVs, creating a new substrate of organic or glass material. Back end wiring levels can be introduced before or after the Si substrate is removed. Accordingly, the substrate can be "swapped", e.g., removed and exchanged with glass or organic material, at various points in the processing.

Embodiments provide many advantages over conventional methods of manufacturing of interposer structures. For example, embodiments provide the following advantages amongst others:

(i) the ability to fabricate small diameter TSVs of less than about 6 μm with a minimum pitch on the order of about 20 μm or less in glass or organic substrates (which would otherwise be very difficult with glass or organic substrates);

(ii) precise positioning of TSVs for semiconductor applications;

(iii) the ability to achieve 90 degree TSV sidewalls in glass and organic interposer substrates;

(iv) the ability to fabricate>1 million TSVs per wafer;

(v) the ability to fabricate TSVs faster than conventional drilling of vias in glass or organic substrates;

(vi) scalability with the desired pitch, TSV dimensions, and position accuracy across different device formation;

(vii) elimination of Cu protrusions into above wiring or dielectric layers resulting from Cu expansion and grain growth during TSV anneal (also known as "pistoning") in glass or organic substrates; and (viii) elimination of glass or organic substrates being exposed to high Cu TSV anneal temperatures (e.g., 375° C.).

The structures can be manufactured in a number of ways using a number of different tools. In general, though, the methodologies and tools are used to form structures with dimensions in the micrometer and nanometer scale. The methodologies, i.e., technologies, employed to manufacture the structures have been adopted from integrated circuit (IC) technology. For example, the structures are built on wafers and are realized in films of material patterned by photolithographic processes on the top of a wafer. In particular, the fabrication of the structures uses three basic building blocks: (i) deposition of thin films of material on a substrate, (ii) applying a patterned mask on top of the films by photolithographic imaging, and (iii) etching the films selectively to the mask.

FIG. 1 shows a beginning structure and respective fabrication processes in accordance with an embodiment of the invention. In particular, the structure 10 includes a substrate 12 with vias 14. In an embodiment, the substrate is a silicon (Si) substrate with vias 14 manufactured using known lithography and etching processes. The vias 14 can be through silicon vias (TSVs) or blind vias, depending on the manufacturing processes, e.g., etch times and thinning processes.

By way of illustrative example, in forming the vias (openings) 14 a resist is formed on the substrate 12 and exposed to energy (light) to form a pattern. An etching process, e.g., reactive ion etching (RIE), is then performed through the pattern to form the vias 14. The vias 14 can range in height from about 10 microns to 100 microns; although other dimensions are contemplated by embodiments. The vias 14 can also have a small pitch (e.g., approximately 20 μm) with a small diameter (e.g., approximately 6 μm). In an embodiment, the vias can be other shapes such as, for example, cylindrical or annular in shape.

Figure 2:
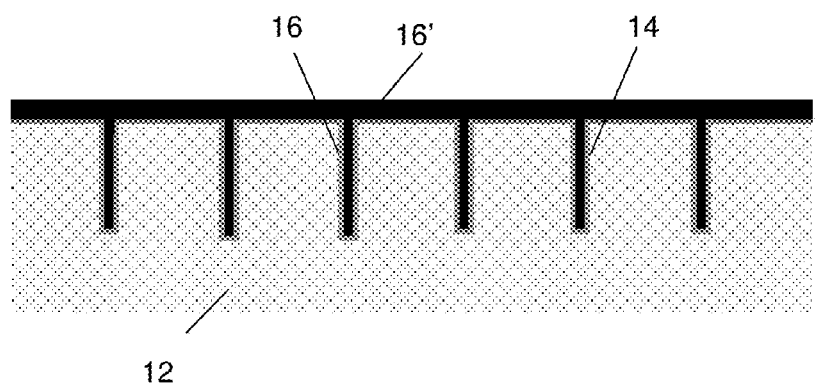
FIG. 2 shows an additional structure and respective fabrication processes of filling material within vias, amongst other fabrication process, in accordance with an embodiment of the invention.

In FIG. 2, the vias 14 are filled with material 16, 16'. In an embodiment, the fill process can result in either annular shaped or solid vias, depending on the desired engineering parameters of the final structure. By way of example, though, the vias 14 are filled with material 16, which is an insulating material. In an embodiment, the insulating material can be oxide deposited on the sidewalls of the vias 14 using a chemical vapor deposition (CVD) process, an atomic layer deposition (ALD) process or a plasma-enhanced chemical vapor deposition (PECVD) process, as examples.

The material 16' is then deposited within the via (opening) 14, over the material 16. In an embodiment, the material 16' is a conductive material of a metal or metal alloy, which is encapsulated by the insulator material 16. In a more specific embodiment, the material 16' can be a combination of layers such as, for example, liners (barrier material) of tantalum and tantalum nitride, which is deposited using a chemical vapor deposition process (CVD), ALD, PECVD or sputtering. The remaining portion of the opening is then filled with a metal material. This metal material can be copper or nickel. The copper or nickel can be deposited using electroplating. It should be understood that other liners and metal fill can be used, e.g., tungsten, etc. In an embodiment, the vias can be annular shape, in which case, oxide would fully encapsulate the material 16'.

It should be understood by those of skill in the art that the deposition process will result in material 16, 16' on a surface of the substrate 12 that can be removed in later processes, if desired. For example, prior to making connections to the vias, the material 16' on the surface of the substrate 12 can be removed in order to avoid electrical shorting.

Figure 3:
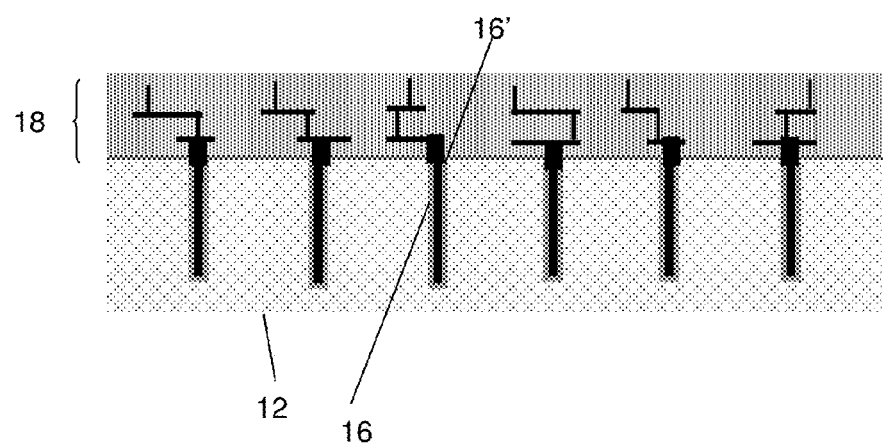
FIG. 3 shows an additional structure and respective fabrication processes of wiring layers formed in electrical contact with the filled vias, amongst other fabrication process, in accordance with an embodiment of the invention.

In FIG. 3, wiring layers 18 are formed in electrical contact with the filled vias, and more specifically the material 16' in each of the vias. The wiring layers 18 are fabricated using conventional back end of the line (BEOL) processes. In an embodiment, this includes the deposition of insulator material, e.g., interlevel dielectric material, followed by lithography, etching and metal deposition processes, well known to those of skill in the art. In an embodiment, the interlevel dielectric material is a low-k or ultra low-k insulator material.

Figure 4:
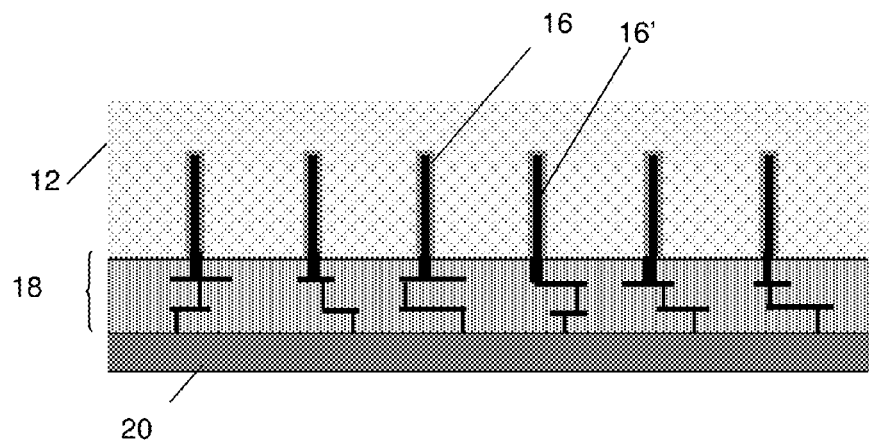
FIG. 4 shows an additional structure and respective fabrication processes of attaching a handler wafer to a surface of the uppermost layer of the wiring layers in accordance with an embodiment of the invention.

As shown in FIG. 4, a handler wafer 20 is attached to a surface of the uppermost layer of the wiring layers 18. In an embodiment, the handler wafer 20 can be a glass or silicon wafer in order to add structural rigidity for further processing.

Figure 5:
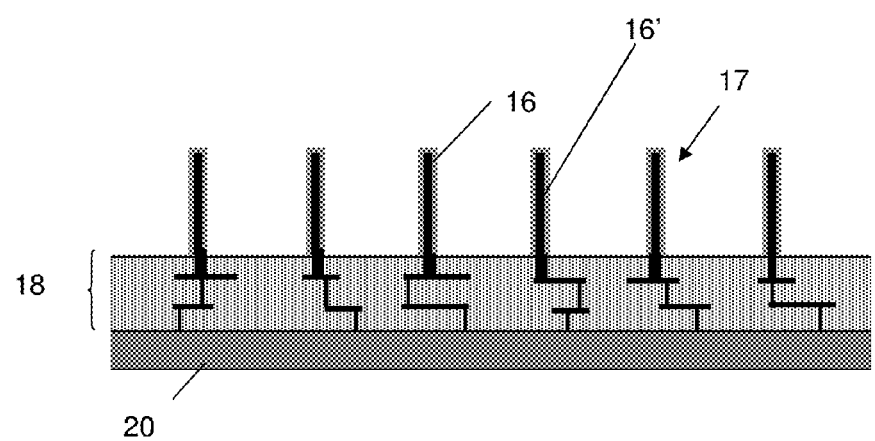
FIG. 5 shows an additional structure and respective fabrication processes of removing a substrate to expose the filled vias, amongst other fabrication process, in accordance with an embodiment of the invention.

In FIG. 5, the substrate is removed to expose the filled vias represented by reference numeral 17. It is noted that after the removal of the substrate, the vias remain lined, e.g., protected, by the insulating material 16. The substrate can be removed by a grinding and then etching processes which are selective to the substrate material. For example, the etching process to remove the substrate can use a selective etchant chemistry of $XeF_2$, which will not significantly attack the insulating material 16. In the implementation, the insulating material 16 will act as an etch stop, wherein the filled vias will remain intact after the removal of the substrate. As described herein, the filled vias can remain connected to metal wiring layers or a wafer handler during the removal of the substrate.

Figure 6:
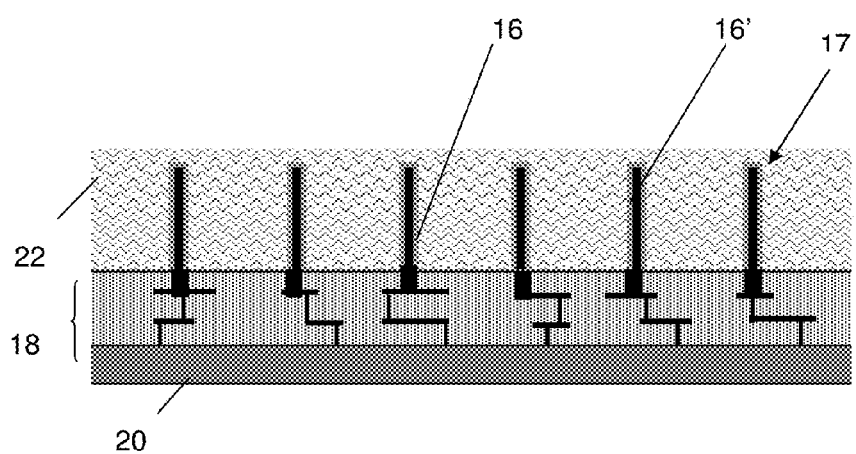
FIG. 6 shows an additional structure and respective fabrication processes of forming a glass or organic substrate about the filled vias, amongst other fabrication process, in accordance with an embodiment of the invention.
Figure 7:
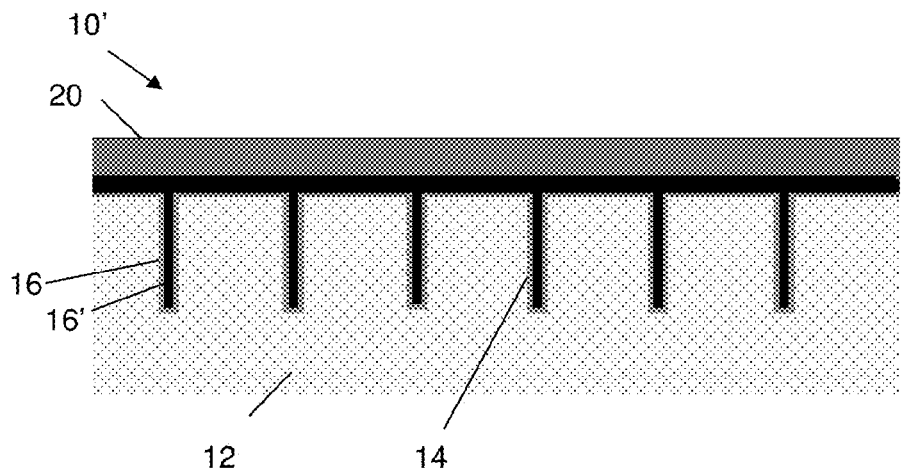
FIG. 7 shows a beginning structure and respective fabrication processes in accordance with another embodiment of the invention.

In FIG. 6, a glass or organic substrate 22 is then formed about the filled vias 17, on the underside of the wiring layers 18. The glass substrate can be formed by a spin on process with a cure of about 400° C. for up to about 1 hour, which has the following properties: fill gaps<100 nm and κ=3.2 (e.g., dielectric permittivity or dielectric constant of the material). In an embodiment, the organic substrate can be parylene, which is deposited using a CVD process at room temperature. In an embodiment, the substrate 12 can also be polystyrene, which can be used, e.g., in organic/hybrid solar cells. The formation of the substrate 22 can be followed by a chemical mechanical process (CMP). In an embodiment, the CMP process can be used to expose the material 16' in case additional wiring levels are to be formed on the substrate 22.

By implementing the processes herein, it is now possible to have vias 17 with a small pitch (e.g., approximately 20 μm) and a small diameter (e.g., approximately 6 μm) in glass or organic substrates, which is otherwise difficult to form in non-Si substrates. Also, it is now possible to achieve 90 degree TSV sidewalls in glass and organic interposer substrates, while also eliminating "pistoning" of TSVs in glass or organic substrates during TSV anneal. The processes also prevent the exposure of glass or organic substrates to high Cu TSV anneal temperatures (e.g., 375° C.).

FIGS. 7-10 show fabrication processes and respective structures in accordance with additional embodiments of the invention. More specifically, in FIG. 7, the structure 10' shows the wafer handler 20 on the material 16'. It should be understood that the processes of forming the vias, materials 16, 16', and the like, remain the same as described with regard to FIGS. 1 and 2. However, in this embodiment, instead of forming of the wiring layers 18 in electrical contact with the filled vias, the processes now include attaching the wafer handler 20 to the material 16'. The handler wafer 20 can be a glass or silicon wafer in order to add structural rigidity for further processing.

Figure 8:
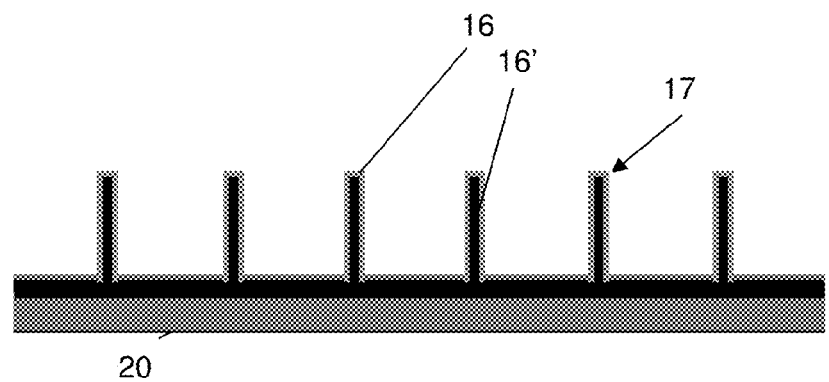
FIG. 8 shows an additional structure and respective fabrication processes of removing a substrate to expose the filled vias, amongst other fabrication process, in accordance with the other embodiment of the invention.

As shown in FIG. 8, the substrate is removed to expose the filled vias, represented by reference numeral 17. It is noted that after the removal of the substrate, the vias remain lined, e.g., protected, by the insulating material 16. The substrate can be removed by grinding and selective etching processes, e.g., selective etchant chemistry of XeF$_2$. In this implementation, the material 16 will act as an etch stop.

Figure 9:
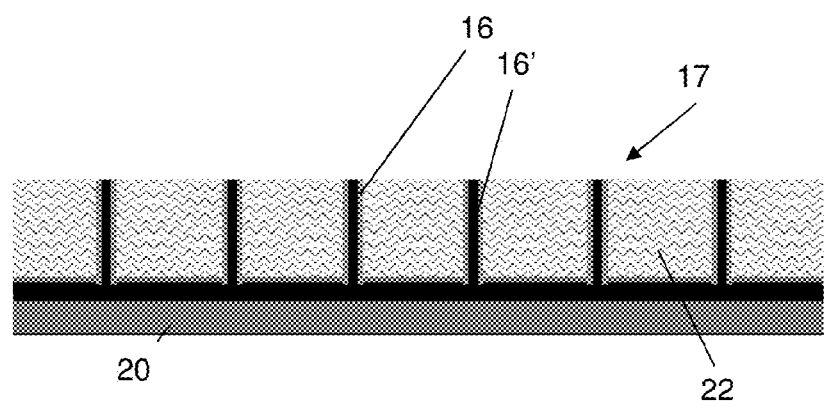
FIG. 9 shows an additional structure and respective fabrication processes of forming a glass or organic substrate about the filled vias, amongst other fabrication process, in accordance with the other embodiment of the invention.

In FIG. 9, a glass or organic substrate 22 can then be formed about the filled vias 17. As previously described, the glass substrate can be formed by a spin on process with a cure of about 400° C. for up to about 1 hour. On the other hand, the substrate 22 can also be parylene or polystyrene. In an embodiment, a CMP or other polishing process is then performed to expose the material 16' of the filled vias 17.

Figure 10:
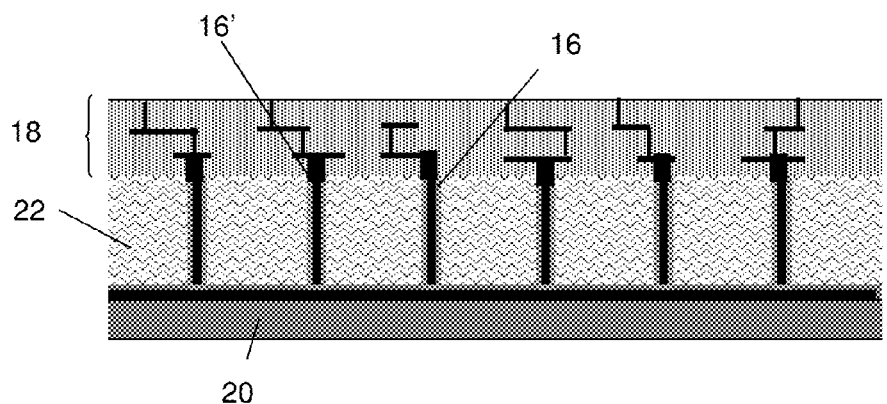
FIG. 10 shows an additional structure and respective fabrication processes of forming wiring layers in electrical contact with the filled vias, amongst other fabrication process, in accordance with the other embodiment of the invention.

In FIG. 10, wiring layers 18 are formed in electrical contact with the filled vias 17, and more specifically the material 16' of the filled vias 17. The wiring layers 18 are fabricated using conventional back end of the line (BEOL) processes. For example, the BEOL processes include the deposition of insulator material, e.g., interlevel dielectric material, followed by lithography, etching and deposition processes, well known to those of skill in the art. In an embodiment, the interlevel dielectric material is a low-k or ultra low-k insulator material. In an additional embodiment, the plated metal 16' (on the handler wafer 22) can be removed during backside processing.

Figure 11:
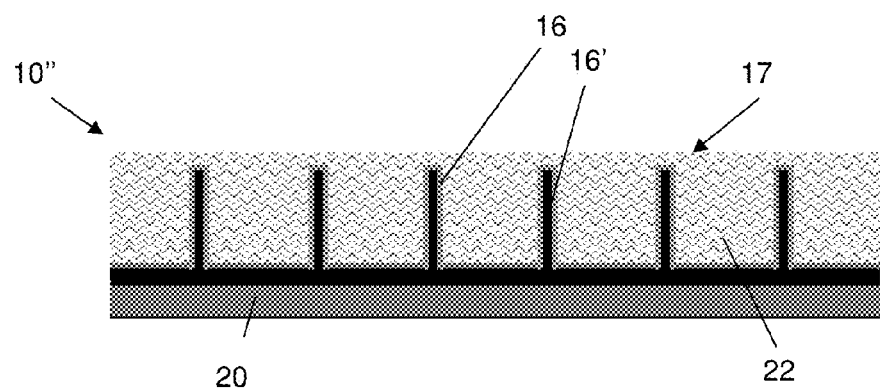
FIG. 11 shows a beginning structure and respective fabrication processes in accordance with yet another embodiment of the invention.
Figure 12:
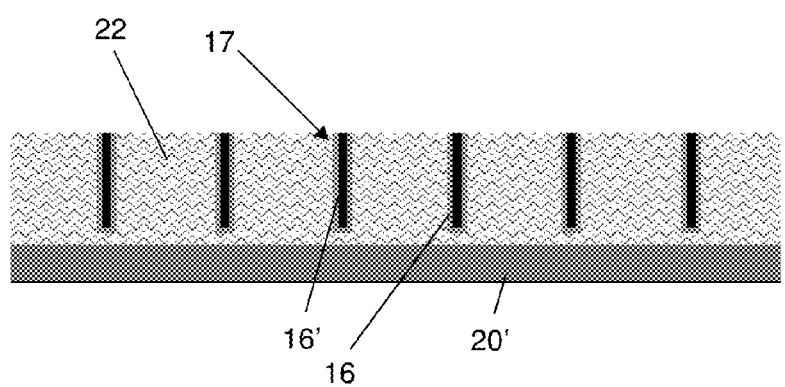
FIG. 12 shows an additional structure and respective fabrication processes of removing a substrate to expose the filled vias, amongst other fabrication process, in accordance with the yet another embodiment of the invention.
Figure 13:
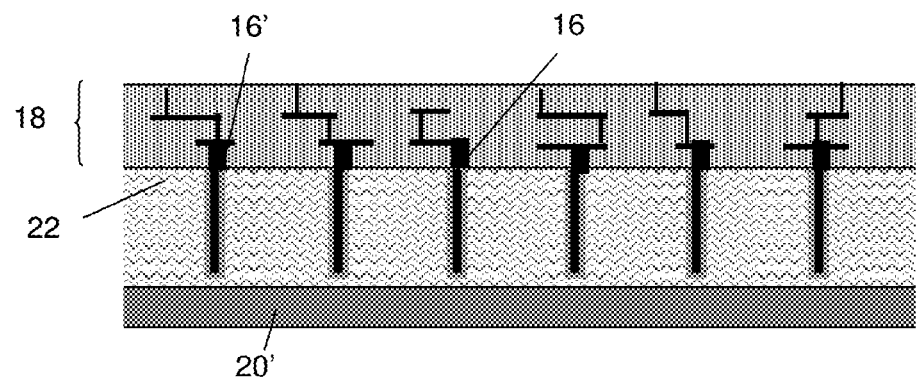
FIG. 13 shows an additional structure and respective fabrication processes of forming wiring layers in electrical contact with the filled vias, amongst other fabrication process, in accordance with the yet another embodiment of the invention.

FIGS. 11-13 show fabrication processes and respective structures in accordance with additional embodiments of the invention. More specifically, in FIG. 11, the structure 10" shows the wafer handler 20 on the glass or organic substrate 22 formed about the filled vias 17. It should be understood that the processes of forming the vias, materials 16, 16' and substrate 22 remain substantially the same as described with regard to FIG. 9. However, in this embodiment, the material 16' will not be exposed during a CMP or polishing process of the substrate 22.

In FIG. 12, the wafer handler 20 is removed, and a new wafer handler 20' is attached to the other side of the structure, with the structure then flipped over. The substrate 22 will then undergo a CMP or polishing process in order to expose the material 16' of the via 17. In this way, compared to the embodiment shown in FIG. 9, the fill material 16' of the via 17 will be exposed on an opposite side of the structure, e.g., the front side of the structure.

In FIG. 13, wiring layers 18 are formed in electrical contact with the filled vias 17, and more specifically the material 16' of the filled vias 17. The wiring layers 18 are fabricated using conventional back end of the line (BEOL) processes. In an embodiment, this includes the deposition of insulator material, e.g., interlevel dielectric material, followed by lithography, etching and deposition processes, well known to those of skill in the art. In an embodiment, the interlevel dielectric material is a low-k or ultra low-k insulator material. In additional embodiments, the plated metal 16' (on the handler wafer 22) can be removed during additional processing.

Figure 14:
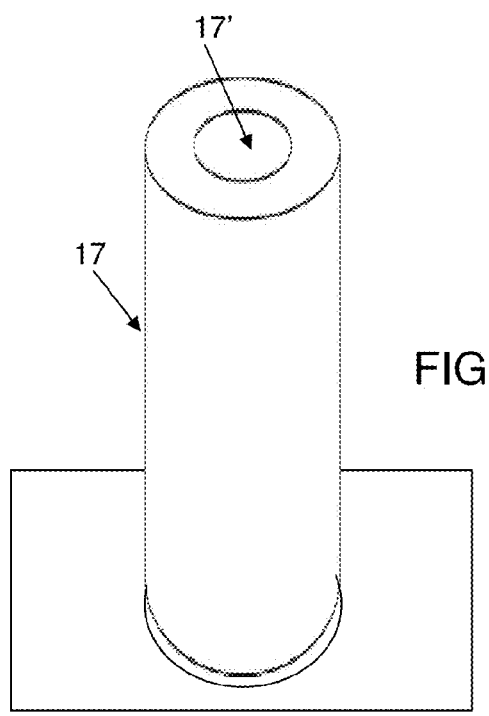
FIG. 14 shows a SEM image of a through via fabricated in accordance with embodiments of the invention.

FIG. 14 shows a SEM image of a through via fabricated in accordance with additional embodiments of the invention. This image shows the via 17' as an annular structure, represented by reference numeral 17". As thus described, this annular via 17 would include oxide or other insulator material completely encapsulating the metal fill, e.g., liner and metal material.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (e.g., a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The description of various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method comprising:
   forming lined metal vias in a substrate;
   removing the substrate, leaving the lined metal vias connected to a surface of wiring layers or a handler wafer; and
   forming a new substrate about the lined metal vias, wherein the connecting the lined metal vias to the wiring layers is provided using back end of line processes.

2. The method of claim 1, wherein forming the lined metal vias comprises:
   etching openings in the substrate;
   depositing insulator material on sidewalls of the openings; and filling the openings with metal material, over the insulator material.

3. The method of claim 2, wherein the filling of the openings with metal material comprises forming a barrier metal on the insulator material followed by electroplating.

4. The method of claim 3, wherein the new substrate and the metal lined vias form a three-dimensional interposer.

5. The method of claim 2, wherein the openings are through silicon vias or blind vias.

6. The method of claim 1, wherein the removing of the substrate comprises forming a handler wafer on the substrate followed by an etching process to remove the substrate, with insulator material of the lined metal vias acting as an etch stop to protect the lined metal vias during the etching process.

7. The method of claim 6, wherein the selective etching process comprises an etchant of $XeF_2$.

8. The method of claim 6, wherein the removing of the substrate comprises grinding the substrate prior to the etching process.

9. The method of claim 6, wherein the forming of the wiring layers is prior to the removing of the substrate.

10. The method of claim 6, wherein the forming of the wiring layers is after the forming of the new substrate about the lined metal vias.

11. The method of claim 10, further comprising polishing the new substrate prior to the forming of the wiring layers such that metal fill within the vias are exposed.

12. The method of claim 1, wherein the lined metal vias are annular vias with insulator material formed entirely about metal material to encapsulate the metal.

13. A method comprising:
   etching a plurality of openings in a silicon based substrate;
   depositing an insulator material on sidewalls of the plurality of openings;
   forming metal material on the insulator material within the plurality of openings;
   removing the silicon based substrate with the insulator material acting as an etch stop to protect the metal material within the plurality of openings, wherein the insulator material and the metal material remain connected to a handler wafer or at least one wiring layer; and
   forming a new substrate over the insulator material covering the plurality of openings,
   wherein the at least one wiring layer is formed in electrical contact with the metal material within the plurality of openings.

14. The method of claim 13, wherein the forming of the metal material comprises forming a barrier metal on the insulator material followed by electroplating of copper.

15. The method of claim 13, wherein the openings are through silicon vias or blind vias.

16. The method of claim 13, wherein the removing of the substrate comprises forming the handler wafer on the substrate followed by a selective etching process with the insulator material acting as the etch stop.

17. The method of claim 16, wherein the removing of the substrate comprises grinding the substrate prior to the selective etching process.

18. The method of claim 16, wherein forming of the at least one wiring layer is prior to the removing of the substrate.

19. The method of claim 16, wherein the forming of the at least one wiring layer is after the forming of the new substrate, which further comprises polishing the new substrate wherein the metal material within the plurality of openings is exposed.

* * * * *